US006654066B1

(12) United States Patent
Vu et al.

(10) Patent No.: US 6,654,066 B1
(45) Date of Patent: Nov. 25, 2003

(54) HIGH-SPEED FLAT-PANEL DISPLAY INTERFACE

(75) Inventors: Ha Chu Vu, San Jose, CA (US); Seema Varma, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/244,568

(22) Filed: Sep. 16, 2002

(51) Int. Cl.[7] .......................... H03M 1/12; G09G 1/04

(52) U.S. Cl. ...................... 348/572; 348/571; 315/367; 315/363

(58) Field of Search ................................ 348/572, 571, 348/573, 574, 575; 315/366, 367, 363

(56) References Cited

U.S. PATENT DOCUMENTS 5,870,154 A * 2/1999 Conover et al. ............ 348/673
6,097,444 A * 8/2000 Nakano ...................... 348/607
6,473,131 B1 * 10/2002 Neugebauer et al. ....... 348/572

OTHER PUBLICATIONS

Marie et al., "R, G, B, Acquisition Interface with Line–Locked Clock Generator for Flat Panel Display," *IEEE Journal of Solid–State Circuit* vol. 33, No. 7, Jul., 1998, 5 pages.

Diniz et al., "Bringing Displays into the Digital Future," *EDN*, Apr. 26, 2001, 6 pages.

* cited by examiner

*Primary Examiner*—Tuyet T. Vo
(74) *Attorney, Agent, or Firm*—Brett A. Hertzberg; Merchant & Gould P.C.

(57) ABSTRACT

A display interface is arranged to processes analog input signals to provide digital output signals. The display interface includes a series of programmable current sources, an input buffer circuit, a first reference buffer circuit, a second reference buffer circuit, and an analog-to-digital converter. The programmable current sources are arranged to provide first and second reference signals, which are buffered by reference buffer circuits and provided to the analog-to-digital converter. The input buffer circuit provides a buffered input signal to the analog-to-digital converter, and operates in an open-loop configuration for improved operating speed. The analog-to-digital converter is configured to provide a digital output signal (DOUT) in response to the buffered input signal. The analog-to-digital converter includes gain and offset settings that are changed by adjusting the programnmable current sources. The programmable current sources and reference buffer circuits are outside of the input signal path.

20 Claims, 2 Drawing Sheets

HIGH-SPEED FLAT-PANEL DISPLAY INTERFACE

FIELD OF THE INVENTION

The present invention is generally related to a flat-panel display interfaces. In particular, the present invention is related to a high-speed flat panel display interface that processes RGB or YUV signals. More particularly, the high-speed flat-panel display interface includes offset and gain adjustments that are outside of the signal path such that high-speed operation is enhanced.

BACKGROUND OF THE INVENTION

Display technologies are commonly available at lower costs due to mass markets such as personal computers (PCs). Displays are commonly available in a two types, namely, cathode ray tube type displays (CRTs) and flat-panel displays. Flat-panel displays include various technologies such as liquid crystal displays (LCDs), and TFT displays. CRT type displays are usually controlled by analog signals, while flat-panel displays can only process digital signals.

Many PC-based video graphics interfaces are configured to provide interface signals that are organized according to graphic color planes such as red, green, and blue (RGB). For example, a typical video graphics interface provides analog graphics signals for the red (R), green (G), and blue (B) color planes, as well as control signals for horizontal (HYSNC) and vertical timings (VSYNC). Since flat-panel displays require digital control signals, the analog graphics signals must be reformatted by an acquisition interface. The acquisition interface samples the RGB signals at a rate that is matched to a pixel clock rate of the video graphics interface. The sampled RGB signals are converted into digital signals, and provided to the flat-panel display at a clock rate that is appropriate for the flat-panel display.

SUMMARY OF THE INVENTION

According to one example, an apparatus that is arranged in accordance with the present invention includes a first programmable current source, a second programmable current source, a third programmable current sources, a first resistor, a second resistor, a first buffer, a second buffer, a third buffer, and an analog-to-digital converter. The first programmable current source is arranged to provide a gain current (IGAIN). The second programmable current source is arranged to provide an offset current (IOS). The third programmable current source is arranged to provide another offset current that is matched to the offset current (IOS). The first resistor is arranged to receive the gain current (IGAIN) and the offset current (IOS) to provide a first reference signal (VPOS). The second resistor is arranged to receive the other offset current (IOS) to provide a second reference signal (VNEG). The first buffer is arranged to provide a first buffered reference signal (VPOS2) in response to the first reference signal (VPOS). The second buffer is arranged to provide a second buffered reference signal (VNEG2) in response to the second reference signal (VNEG). The third buffer that is arranged to provide a buffered input signal (VX2) in response to an input signal (VX), wherein the third buffer is in an open loop configuration. The analog-to-digital converter is configured to receive the buffered input signal, the first buffered reference signal (VPOS2), and the second buffered reference signal (VNEG2). The analog-to-digital converter is also configured to provide a digital output signal (DOUT) in response to the buffered input signal (VX2). The analog-to-digital converter includes a gain setting that is changed by adjusting the first programmable current source, and an offset setting that is changed by adjusting the second and third programmable current sources.

According to another example, an apparatus that is arranged in accordance with the present invention includes a first current source, a gain DAC, an offset DAC, a first current mirror circuit, a second current mirror circuit, a third current mirror circuit, a fourth current mirror circuit, a first resistor, a second resistor, and an analog-to-digital converter. The first current source is arranged to provide a full-scale gain current (IGFS). The gain DAC is arranged to provide a gain current (IGAIN) by scaling the full-scale gain current (IGFS) in response to a gain setting (GAIN). The first current mirror circuit is arranged to provide a full-scale offset current (IOSFS) in response to a first current, wherein the first current includes the gain current (IGAIN) such that the full-scale offset current (IOSFS) is related to the gain current (IGAIN). The second current mirror circuit is arranged to provide a second current in response to the first current such that the second current is related to the gain current (IGAIN). The offset DAC is arranged to provide an offset current (IOS) by scaling the full-scale offset current (IOSFS) in response to an offset setting (OFS). The third current mirror circuit is arranged to provide a third current in response to the offset current (IOS) such that the third current is related to the offset current (IOS). The first resistor (R1) is arranged to provide a first reference signal (VPOS) in response to the second and third currents. The fourth current mirror circuit is arranged to provide a fourth current in response to the offset current (IOS) such that the fourth current is related to the offset current (IOS). The second resistor (R2) is arranged to provide a second reference signal (VNEG) in response to the fourth current. The analog-to-digital converter is responsive to an input signal (VX2), the first reference signal (VPOS) and the second reference signal (VNEG). The analog-to-digital converter is configured to provide a digital output signal (DOUT) in response to the input signal (VX2). The analog-to-digital converter has an associated gain characteristic that is adjusted with the gain setting (GAIN), and an associated offset characteristic that is changed by adjusting the offset setting (OFS).

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention is generally related to flat-panel display interfaces. In particular, the present invention is related to a high-speed flat panel display interface that processes RGB or YUV signals. More particularly, the high-speed flat-panel display interface includes offset and gain adjustments that are outside of the signal path such that high-speed operation is enhanced.

Briefly stated, a display interface is arranged to processes analog input signals and provide digital output signals. The display interface includes a series of programmable current sources, an input buffer circuit, a first reference buffer circuit, a second reference buffer circuit, and an analog-to-digital converter. The programmable current sources are arranged to provide first and second reference signals, which are buffered by reference buffer circuits and provided to the analog-to-digital converter. The input buffer circuit provides a buffered input signal to the analog-to-digital converter, and operates in an open-loop configuration for improved operating speed. The analog-to-digital converter is configured to provide a digital output signal (DOUT) in response to the buffered input signal. The analog-to-digital converter includes gain and offset settings that are changed by adjusting the programmable current sources. The programmable current sources and reference buffer circuits are outside of the input signal path.

The above-described features, as well as others, will be described below with reference to the accompanying drawings.

Exemplary Flat-Panel Display Interface System

Figure 1:
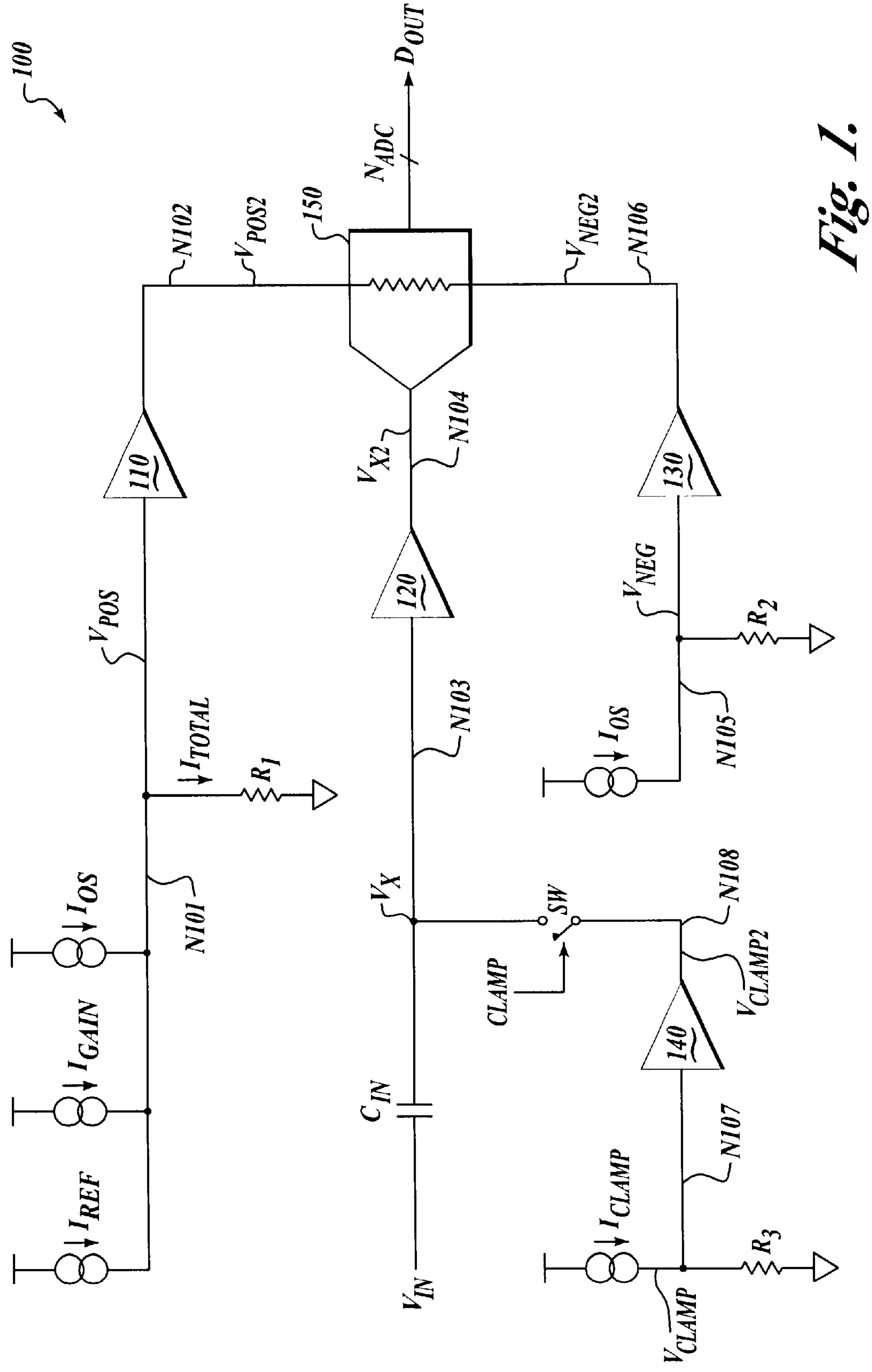
FIG. 1 is a schematic diagram of an exemplary flat-panel display interface system.

FIG. 1 is a schematic diagram of an exemplary flat-panel display interface system (100) that is arranged in accordance with the present invention. The flat-panel display interface system (100) includes five programmable current sources, four buffers (110–140), three resistors (R1–R3), a capacitor (CIN), a clamp switch (SW), and an analog-to-digital converter (150).

The first, second, and third programmable current sources are coupled to node N101. The fourth programmable current source is coupled to node N105, while the fifth programmable current source is coupled to node N107. Resistor R1 is coupled between node 101 and ground. Resistor R2 is coupled between node N105 and ground. Resistor R3 is coupled between node N107 and ground. The first buffer (110) is coupled between node N101 and N102. The second buffer (120) is coupled between node N103 and N104. The third buffer (130) is coupled between node N105 and N106. The fourth buffer (140) is coupled between node N107 and node N108. The clamp switch is coupled between node N103 and N108. The analog-to-digital converter (ADC 150) is coupled to nodes N102, N104, and N106.

The first, second, and third programmable current sources are configured to provide a reference current (IREF), a gain current (IGAIN), and an offset current (IOS) to node N101. The currents are combined to provide a total current (ITOTAL) to resistor R1. Resistor R1 generates a first signal (VPOS) in response to the total current (ITOTAL). The first buffer circuit (110) is arranged to buffer the first signal (VPOS) to provide a first buffered signal (VPOS2) to ADC 150.

The fourth programmable current source is configured to provide another offset current (IOS) to resistor R2. Resistor R2 generates a second signal (VNEG) in response to the offset current (IOS). The third buffer (130) is arranged to buffer the second signal (VNEG) to provide a second buffered signal (VNEG2) to ADC 150.

The fifth programmable current source is configured to provide a clamp current (ICLAMP) to resistor R3. Resistor R3 generates a third signal (VCLAMP) in response to the clamp current (ICLAMP). The fourth buffer (140) is arranged to buffer the third signal (VCLAMP) and provide a third buffered signal (VCLAMP2) to node N108. The clamps switch (SW) is arranged to couple the third buffered signal (VCLAMP2) to, node N103 when activated in response to a clamp control signal (CLAMP).

Capacitor CIN is arranged to receive an input signal (VIN) and couple a fourth signal (VX) to node N103, where the fourth signal (VX) corresponds to an AC coupled version of the input signal (VIN). The second buffer circuit (120) is arranged to provide a fourth buffered signal (VX2) to ADC 150 in response to the fourth signal (VX).

ADC 150 provides an N-bit (NADC) digital output signal (DOUT) in response to VX2. The input signal range of ADC 150 is limited by VPOS2 and VNEG2. More particularly, the input signal range (VRANGE) corresponds to:

$$VRANGE=VPOS2-VNEG2$$

$$VRANGE=ITOTAL*R1-IOS*R2.$$

$$VRANGE=(IREF+IGAIN+IOS)*R1-IOS*R2$$

When R1 and R2 have equal values (e.g., R), the input signal range (VRANGE) is determined as:

$$VRANGE=(IREF+IGAIN)*R.$$

The minimum input range is given as IREF*R. However, IREF can be set to zero where a minimum input of zero is desired.

The ADC provides a system gain (SGAIN) that is determined by the input signal range (VRANGE) and the bit resolution (NADC) of the ADC. The system gain (SGAIN) corresponds to:

$$SGAIN=(2^{NADC}-1)/VRANGE$$

$$SGAIN=(2^{NADC}-1)/[(IGAIN+IREF)*R] \text{ lsb/volt.}$$

The value of the system offset (VOS) is determined by the clamp voltage (VCLAMP) and the negative supply voltage of ADC 150 (VNEG). Thus, the system offset (VOS) voltage corresponds to:

$$VOS=VCLAMP2-VNEG2$$

$$VOS=ICLAMP*R3-IOS*R2$$

$$VOS=(ICLAMP-IOS)*R, \text{ when } R2=R3=R.$$

As illustrated in FIG. 1, adjustments to the offset voltage, the gain, and the reference level are adjustable without affecting the signal path of VIN to ADC 150, and thus do not limit the system bandwidth. Buffer 120 is run open loop such that high overall bandwidths are obtained on the order of 500 MHz. Gain adjustments are made by changing the overall voltage (VPOS, VNEG) across ADC 150 with IGAIN. Offset adjustments are made by changing the DC level of the reference voltages of ADC 150. Clamp levels can be adjusted between RGB and YUV levels by programming the clamp current (ICLAMP).

Exemplary Flat-Panel Display Interface Circuit

Figure 2:
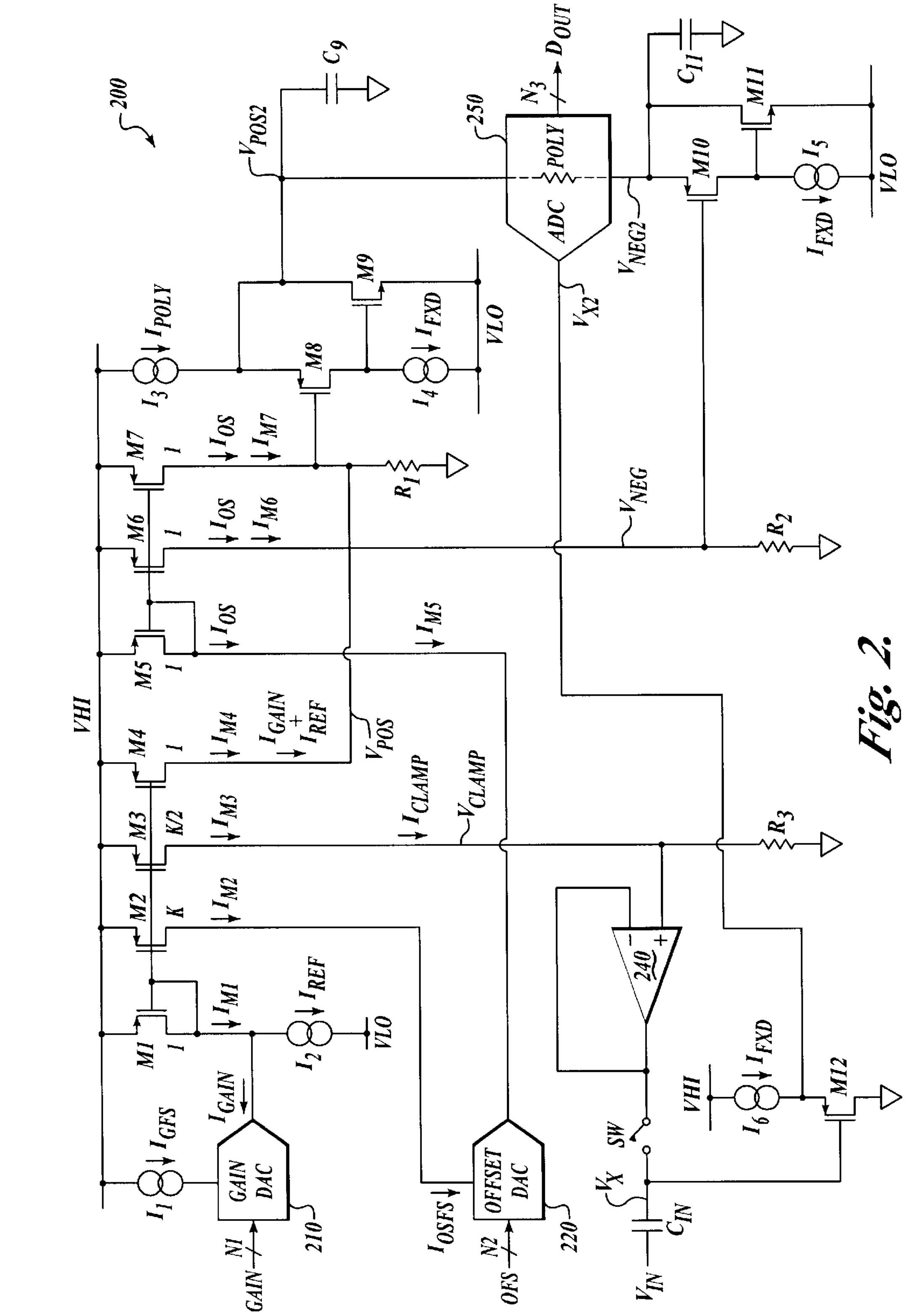
FIG. 2 is a schematic diagram of an exemplary flat-panel display interface circuit, in accordance with the present invention.

FIG. 2 is a schematic diagram of an exemplary flat-panel display interface circuit (200) that is arranged in accordance with the present invention. The flat-panel display interface circuit (200) includes six current sources (I1–I6), twelve transistors (M1–M12), three resistors (R1–R3), three capacitors (CIN, C9, C11), a clamp switch (SW), a gain DAC (210), an offset DAC (220), a buffer (240), and an analog-to-digital converter (250). The circuit illustrated in FIG. 2 provides the same overall functionality of the system illustrated in FIG. 1, with further implementation details.

Gain DAC 210 includes a full scale input that is coupled to current source I1. Transistor M1 includes a source that is coupled to VHI, and a gate and drain that are coupled to the output of gain DAC 210. Current source 12 is coupled between the output of gain DAC 210 and VLO. Transistors M1–M4 share common gate and source connections. Transistor M1 is related to transistors M2–M4 by ratios of 1:K, 1:K/2, and 1:1, respectively. Transistor M2 includes a drain that is coupled to the full-scale input of the offset DAC (220). Transistor M3 includes a drain that is coupled to resistor R3, and a non-inverting input of buffer 240. Transistor M4 includes a drain that is coupled to resistor R1, the drain of transistor M7, and the gate of transistor M8. Transistor M5 includes a source that is coupled to VHI, and a gate and drain that are coupled to the output of offset DAC 220. Transistors M5–M7 share common gate and source connections, and are matched to one another. Current source 13 is coupled to the source of transistor M8, the drain of transistor M9, and a positive input of ADC 250. Current source 14 is coupled to the drain of transistor M8 and the gate of transistor M9. Capacitor C9 is coupled to the positive input of ADC 250. The drain of transistor M6 is coupled to resistor R2 and the gate of transistor M10. The source of transistor M10 is coupled to the drain of transistor M11 and a negative input of ADC 250. The drain of transistor M10 is coupled to current source 15 and the gate of transistor M11. Capacitor C11 is coupled to the negative input of ADC 250. Buffer 240 includes an inverting input and an output that are coupled to the clamp switch (SW). Capacitor CIN is coupled between VIN and the clamp switch (SW), which is coupled to the gate of transistor M12. The source of transistor M12 is coupled to current source I6 and the signal input of ADC 250.

The gain DAC (210) receives a full-scale gain current (IGFS) from current source I1. The gain DAC (210) is arranged to provide a scaled gain current (IGAIN) in response to an N-bit (N1) gain control signal (GAIN), where the scaled gain current (IGAIN) is related to the full-scale gain current (IGFS) as:

$$IGAIN=IGFS*GAIN/(2^{N1}-1).$$

The offset DAC (220) receives another full-scale offset current (IOSFS) from transistor M2. The offset DAC (220) is arranged to provide a scaled offset current (IOS) in response to an N-bit (N2) offset control signal (OFS), where the scaled offset current (IOS) is related to the full-scale offset current (IOSFS) as:

$$IOS=IOSFS*OFS/(2^{N2}-1).$$

The full-scale offset current (IOSFS) is related to the scaled gain current (IGAIN) through transistors M1 and M2 such that IOSFS=K*(IGAIN+IREF). Substituting into the full-scale offset current equation yields:

$$IOS=K*(IGAIN+IREF)*OFS/(2^{N2}-1).$$

$$IOS=K*([IGFS*GAIN/(2^{N1}-1)]+IREF)*OFS/(2^{N2}-1).$$

Setting the reference current equal to the full-scale gain current yields:

$$IOS=K*IREF*(1+[GAIN/(2^{N1}-1)])*(OFS/(2^{N2}-1)).$$

Transistor M5 reflects the scaled offset current (IOS) to transistors M6 and M7, which are arranged in a current mirror-configuration. Transistor M1 reflects the scaled gain current (IGAIN) and the reference current (IREF) to transistors M2–M4, which are also arranged in a current mirror configuration. Resistor R1 combines the currents from transistors M4 and M7 to provide a VPOS signal, which is given by: VPOS=R1*(IGAIN+IREF+IOS). Resistor R2 receives the current from transistor M6 and provides a VNEG signal, which is given by: VNEG=R2*IOS.

Capacitor CIN is arranged to receive an input signal (VIN) and provide another signal (VX), which corresponds to an AC coupled version of the input signal (VIN). Transistor M12 and current source 16 are configured to operate as a source follower circuit that provides signal VX2 in response to signal VX. Signal VX2 is provided as an input signal to ADC 250. Transistors M8–M9 and current sources I3–I4 are configured to operate as a Gm enhanced source follower circuit. Similarly, transistor M10–M11 and current source 15 are configured to operate as another Gm enhanced source follower circuit. Each of the source follower circuits provides buffering effects in the circuit, with matched DC offsets. The DC offsets correspond to the gate-source voltage (VGS) of the transistor in the source follower circuit. For example, the VGS of transistor M8 should match the VGS of transistor M10, as well as the VGS of transistor M12.

$$VPOS2=VPOS+VGS$$

$$VNEG2=VNEG+VGS$$

$$VX2=VX+VGS$$

Transistor M3 is arranged to provide a clamp current (ICLAMP) to resistor R3 such that a clamp voltage (VCLAMP) is provided to an input of buffer 240. The clamp current (ICLAMP) is related to the gain scaled current (IGAIN) and the reference current as: ICLAMP=(IGAIN+IREF)*K/2=IOSFS/2, for equal positive and negative offset adjustment. Buffer 240 and switch SW form a clamp circuit that is activated to limit the signal level associated with the un-buffered input signal (VX). When R1=R2=R3=R, the overall system offset (VOS) may be determined as:

$$VOS=(ICLAMP-IOS)*R$$

$$VOS=((IOSFS/2)-IOS)*R$$

$$VOS=R*K*IREF*(1+[GAIN/(2^{N1}-1)])*([1/2]-[OFS/(2^{N2}-1)])$$

When R1 and R2 have equal values (e.g., R), the input signal range (VRANGE) is determined as: VRANGE=(IREF+IGAIN)*R. The minimum input range is given as IREF*R. However, IREF can be set to zero where a minimum input of zero is desired.

The ADC provides a system gain (SGAIN) that is determined by the input signal range (VRANGE) and the bit resolution (N3) of the ADC. The system gain (SGAIN) corresponds to:

$$SGAIN=(2^{N3}-1)/VRANGE$$

$$SGAIN=(2^{N3}-1)/[(IGAIN+IREF)*R]$$

$$SGAIN=(2^{N3}-1)/(R*IREF*[1+GAIN/(2^{N1}-1)]) \text{ lsb/volt.}$$

The transistors illustrated in FIG. 2 are field effect transistors (FETs). However, the same circuit configuration is equally applicable for bipolar junction transistors (BJTs).

Other example circuits that perform the functions described above are considered within the scope of the present invention.

As described previously, transistor M12 and current source 16 are arranged to operate as a source follower. The source follower operates as an input buffer that provides a buffered signal (VX2) to ADC 250. The input buffer is operated in open loop (without feedback) so that the operating speed is only limited by the settling time of the input buffer. A typical input buffer has a bandwidth of 500 MHz, which is suitable for an ADC that operates at frequencies in the 200 MHz range.

Transistors M8 and M10 are matched to transistor M12. Current source I6 is matched to current source I4 and I5 such that each provides a fixed current level (IFXD). Transistor M8 and current source I4 form a gm enhanced source follower that operates as a reference buffer. Transistor M10 and current source I5 form another gm enhanced source follower that operates as another reference buffer. Since the sizes of the input transistors for the input buffer and the reference buffers are matched, the offsets in these buffers also matches (VGS(M12)=VGS(M8)=VGS(M10)).

Current source 12 provides a reference current (IREF) as previously described. In one example, reference current IREF is proportional to VBG/Ra, where VBG is a band-gap voltage and Ra is a resistor. Since VBG is relatively invariant across processing and temperature variations, the reference and clamp voltages should remain constant. In other words, changes in resistor values dues to processing variations will not cause a change in the reference and clamp voltages. For example, VCLAMP=ICLAMP*R3=k1*IGAIN*R3=k2*VBG*R3/Ra, where k1 and k2 are constants.

The reference buffers are biased with two current sources. Each reference buffer includes a current source to bias the source follower transistor with current IFXD, and both reference circuits also process another current from current source 13, which has a level corresponding to IPOLY. ADC 250 includes a resistor ladder that is biased by a current corresponding to the difference between IPOLY and IFXD. Current IPOLY is also proportional to VBG/Ra.

Current IPOLY is greater than IFXD such that the voltage tap point in the resistor ladder of ADC 250 are predominately controlled by IPOLY. Since IPOLY is proportional to VBG/Ra, the voltages at the tap point in the resistor ladder of ADC 250 are maintained as fixed voltages. In other in words, variations in the resistance values that are associated with the resistor ladder are cancelled by variations in Ra. In example, resistor Ra and the resistor ladder in ADC 250 are designed as polysilicon-type resistors.

Current sources I4–I6 are all arranged to provide a bias current that has an level corresponding to IFXD. In one embodiment of the present invention, the bias current (IFXD) varies with clock frequency such that the current level increases with higher clock frequencies, and decreases with lower clock frequencies. By varying the bias current (IFXD) with frequency, power conservation is provided.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus, comprising:

a first programmable current source that is arranged to provide a gain current (IGAIN);

a second programmable current source that is arranged to provide an offset current (IOS);

a third programmable current source that is arranged to provide another offset current that is matched to the offset current (IOS);

a first resistor that is arranged to receive the gain current (IGAIN) and the offset current (IOS) to provide a first reference signal (VPOS);

a second resistor that is arranged to receive the other offset current (IOS) to provide a second reference signal (VNEG);

a first buffer that is arranged to provide a first buffered reference signal (VPOS2) in response to the first reference signal (VPOS);

a second buffer that is arranged to provide a second buffered reference signal (VNEG2) in response to the second reference signal (VNEG);

a third buffer that is arranged to provide a buffered input signal (VX2) in response to an input signal (VX), wherein the third buffer is in an open loop configuration; and an analog-to-digital converter that is configured to receive the buffered input signal, the first buffered reference signal (VPOS2), and the second buffered reference signal (VNEG2), wherein the analog-to-digital converter is configured to provide a digital output signal (DOUT) in response to the buffered input signal (VX2), wherein the analog-to-digital converter includes a gain setting that is changed by adjusting the first programmable current source, and wherein the analog-to-digital converter also includes an offset setting that is changed by adjusting the second and third programmable current sources.

2. The apparatus of claim 1, wherein the first, second, and third buffers are matched to one another.

3. The apparatus of claim 1, wherein the analog-to-digital converter is configured to provide a signal range (VRANGE) that corresponds to:

$$VRANGE=VPOS2-VNEG2.$$

4. The apparatus of claim 1, wherein the first and second resistors each have a value corresponding to R, and wherein the analog-to-digital converter is configured to provide a signal range (VRANGE) that corresponds to:

$$VRANGE=IGAIN*R.$$

5. The apparatus of claim 1, wherein the first and second resistors each have a value corresponding to R, the analog-to-digital has an associated signal range (VRANGE) and a bit-resolution (NADC), and wherein the analog-to-digital converter has an associated system gain (SGAIN) that corresponds to:

$$SGAIN=(2^{NADC}-1)/VRANGE.$$

6. The apparatus of claim 1, further comprising:

a fourth programmable current source that is arranged to provide a clamp current (ICLAMP);

a third resistor that is arranged to receive the clamp current (ICLAMP) to provide a clamp signal (VCLAMP); and a fourth buffer that is arranged to provide a buffered clamp signal (VCLAMP2) in response to the clamp signal (VCLAMP), wherein the fourth buffer is configured to clamp a signal level that is associated with the input signal (VX).

7. The apparatus of claim 1, further comprising: a fifth programmable current source that is arranged to provide a reference current (IREF) to the first resistor such that the first reference signal (VPOS) is determined from the reference current (IREF), the gain current (IGAIN), and the offset current (IOS).

8. The apparatus of claim 7, wherein the first and second resistors each have a value corresponding to R, and wherein the analog-to-digital converter is configured to provide a signal range (VRANGE) that corresponds to:

$$VRANGE=(IREF+IGAIN)*R.$$

9. The apparatus of claim 7, wherein the first and second resistors each have a value corresponding to R, the analog-to-digital has an associated signal range (VRANGE) and a bit-resolution (NADC), and wherein the analog-to-digital converter has an associated system gain (SGAIN) that corresponds to:

$$SGAIN=(2^{NADC}-1)/[(IREF+IGAIN)*R].$$

10. The apparatus of claim 7, wherein the analog-to-digital converter has an associated system offset (VOS) that corresponds to:

$$VOS=(VCLAMP2-VNEG2).$$

11. The apparatus of claim 7, wherein the first and second resistors each have a value corresponding to R, and wherein the analog-to-digital converter has an associated system offset (VOS) that corresponds to:

$$VOS=(ICLAMP-IOS)*R.$$

12. An apparatus, comprising:

a first current source that is arranged to provide a full-scale gain current (IGFS);

a gain DAC that is arranged to provide a gain current (IGAIN) by scaling the full-scale gain current (IGFS) in response to a gain setting (GAIN);

a first current mirror circuit that is arranged to provide a full-scale offset current (IOSFS) in response to a first current, wherein the first current includes the gain current (IGAIN) such that the full-scale offset current (IOSFS) is related to the gain current (IGAIN);

a second current mirror circuit that is arranged to provide a second current in response to the first current such that the second current is related to the gain current (IGAIN);

an offset DAC that is arranged to provide an offset current (IOS) by scaling the full-scale offset current (IOSFS) in response to an offset setting (OFS);

a third current mirror circuit that is arranged to provide a third current in response to the offset current (IOS) such that the third current is related to the offset current (IOS);

a first resistor (R1) that is arranged to provide a first reference signal (VPOS) in response to the second and third currents;

a fourth current mirror circuit that is arranged to provide a fourth current in response to the offset current (IOS) such that the fourth current is related to the offset current (IOS);

a second resistor (R2) that is arranged to provide a second reference signal (VNEG) in response to the fourth current; and an analog-to-digital converter that is responsive to an input signal (VX2), the first reference signal (VPOS) and the second reference signal (VNEG), wherein the analog-to-digital converter is configured to provide a digital output signal (DOUT) in response to the input signal (VX2), wherein the analog-to-digital converter has an associated gain characteristic that is adjusted with the gain setting (GAIN), and wherein the analog-to-digital converter also has an associated offset characteristic that is changed by adjusting the offset setting (OFS).

13. The apparatus of claim 12, further comprising a second current source that is arranged to provide a reference current (IREF), wherein the first current mirror circuit is further arranged to provide the full-scale offset current (IOSFS) in response to the gain current (IGAIN) and the reference current (IREF) according to a first scaling factor (K) such that the full-scale offset current (IOSFS) is related to the gain current (IGAIN) by: IOSFS=K*(IGAIN+IREF).

14. The apparatus of claim 12, further comprising:

a fifth current mirror circuit that is arranged to provide a clamp current (ICLAMP) in response to the first current such that the clamp current (ICLAMP) is related to the gain current (IGAIN);

a third resistor (R3) that is arranged to provide a clamp signal (VCLAMP) in response to the clamp current (ICLAMP);

an input buffer that is arranged to provide the input signal (VX2) in response to an un-buffered input signal (VX), wherein the input buffer is operated in an open loop configuration; and a clamp circuit that is configured to limit the signal level associated with the un-buffered input signal (VX) in response to the clamp voltage (VCLAMP).

15. The apparatus of claim 14, wherein the second current mirror circuit is further arranged to provide the third current in response to the gain current (IGAIN) and the reference current (IREF) according to a second scaling factor (K/2) such that the third current corresponds to (IGAIN+IREF)*K/2, resistors R1 R2, and R3 each have a value corresponding to R, and the apparatus has an overall system offset (VOS) that corresponds to: $VOS=R*K*IREF*(1+[GAIN/(2^{N1}-1)])*(OFS/(2^{N2}-1))/2$.

16. The apparatus of claim 14, wherein the gain DAC has a bit resolution corresponding to N1, resistor R1 and resistor R2 have equal values of R, the full-scale gain current (IGFS) is determined by the reference current (IREF), the analog-to-digital converter has a bit resolution corresponding to N3, and the analog-to-digital converter has a system gain that corresponds to:

$$SGAIN=(2^{N3}-1)/(R*IREF*[1+GAIN/(2^{N1}-1)]).$$

17. The apparatus of claim 14, further comprising a first reference buffer that is arranged to provide a first buffered reference signal (VPOS2) to the analog-to-digital converter in response to the first reference signal (VPOS), and a second reference buffer that is arranged to provide a second buffered reference signal (VNEG2) to the analog-to-digital converter in response to the second reference signal (VNEG), wherein the first and second reference buffers have offset characteristics that are matched to the input buffer.

18. The apparatus of claim 17, wherein the input buffer includes a first transistor that is configured as a source follower that is biased by a first bias current, the first reference buffer includes a second transistor that is configured as a source follower that is biased by a second bias current, and the second reference buffer includes a third transistor that is configured as a source follower that is biased by a third bias current, wherein the first, second, and third bias currents each have an associated level that corresponds to IFXD.

19. The apparatus of claim 18, wherein the levels that are associated with the first, second, and third bias currents are adjusted in response to a clock signal that is associated with the analog-to-digital converter such that power consumption is decreased when a frequency associated with the clock signal is reduced.

20. The apparatus of claim 18, further comprising a fourth bias current that is coupled to the analog-to-digital converter and the first reference buffer, wherein a level (IPOLY) that is associated with the fourth bias current is greater than IFXD, and wherein the analog-to-digital converter includes a resistor ladder that is configured such that temperature and process related variations in the resistor ladder are tracked by changes in the fourth bias current.

* * * * *

UNITED STATES PATENT AND TRADEMARK OFFICE

CERTIFICATE OF CORRECTION

PATENT NO. : 6,654,066 B1 
DATED : November 25, 2003
INVENTOR(S) : Vu et al.

It is certified that error appears in the above-identified patent and that said Letters Patent is hereby corrected as shown below:

<u>Column 5,</u>
Line 11, "Current source 12" should read -- Current source I2 --
Line 25, "13 is coupled" should read -- I3 is coupled --
Line 27, "source 14 is coupled" should read -- source I4 is coupled --
Line 33, "current source 15" should read -- current source I5 --

<u>Column 6,</u>
Line 14, "current source 16" should read -- current source I6 --

<u>Column 7,</u>
Line 5, "source 16" should read -- source I6 --
Line 23, "Current source 12" should read -- Current source I2 --
Line 38, "source 13" should read -- source I3 --

Signed and Sealed this

Second Day of March, 2004

JON W. DUDAS
*Acting Director of the United States Patent and Trademark Office*